April 25, 1961 E. A. HOSKINSON 2,981,850
TRANSISTOR PULSE RESPONSE CIRCUIT
Filed Aug. 8, 1956
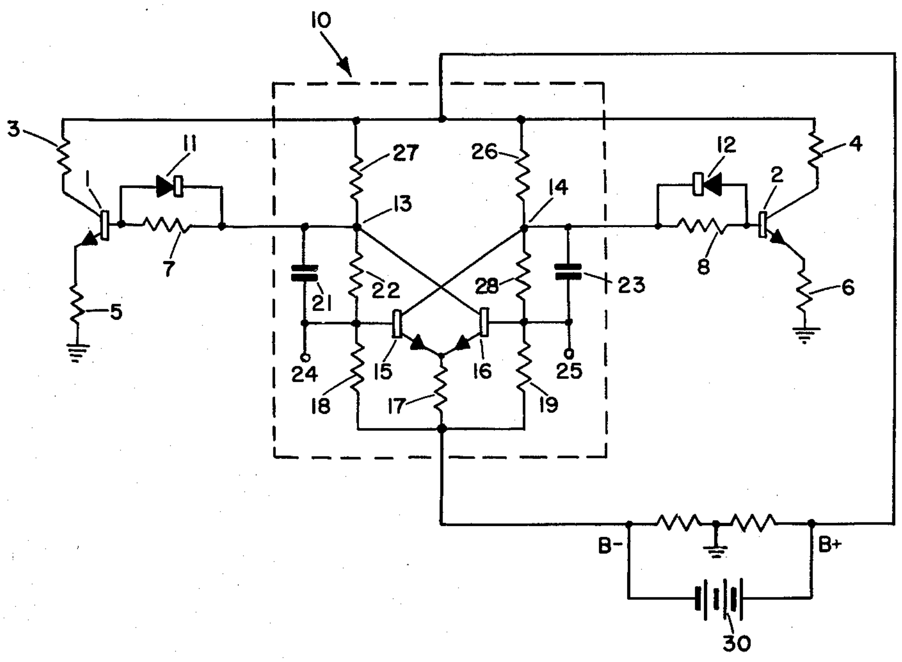
*INVENTOR.*
EUGENE A. HOSKINSON
*BY* Harold J. Downs
ATTORNEY 2,981,850

TRANSISTOR PULSE RESPONSE CIRCUIT

Eugene A. Hoskinson, Van Nuys, Calif., assignor to North American Aviation, Inc.

Filed Aug. 8, 1956, Ser. No. 602,765

4 Claims. (Cl. 307—88.5)

This invention pertains to transistor circuits and more particularly to a transistor amplifier with fast rise and fall time characteristics in its output circuit.

In the application of the transistor to electronic circuits a number of problems are presented which do not occur in the well-known vacuum tube circuits. Variations in individual transistor operation caused by temperature effects, noise, and nonuniformity of manufacture, to mention a few items, seriously effect the efficiency and stability of transistor circuits. One of the more important problems peculiar to a transistor is that of cutting off the flow of current in the collector or emitter electrode a short time after the input signal to the transistor has been removed.

In a transistor comprising collector, emitter, and base electrodes, the collector and emitter are of the same polarity and the base is of opposite polarity. In an N–P–N transistor, for example, the emitter and collector electrodes contain an excess of electrons, or negative carriers, and the base electrode contains an excess of holes, or positive carriers. The excess holes in the base are called majority carriers and the electrons injected into the base upon transistor conduction are called minority carriers. During conduction some of these injetced minority carriers will diffuse through the base and be attracted to the collector, increasing the collector current. When the transistor becomes saturated a large concentration of minority carriers arrives at the collector-base junction. Because of the voltage drop across the load connected to the output collector circuit, the collector voltage is not high enough to gather all of the minority carriers and therefore some of the excess carriers are stored in the base. When the operating signal is removed from the transistor the excess minority carriers in the base will drift slowly into the collector. Consequently, a collector current is maintained, in spite of the fact the signal voltage on the base has dropped to zero, until the excess minority carriers in the base-collector region are dissipated through the collector. In the above discussion it is assumed that the load impedance is connected to the collector circuit. The same minority carrier storage effect will occur near the emitter-base junction if the load impedance is connected to the emitter.

The minority carrier storage effect is highly undesirable in transistor circuits which require the output current supplied by the collector or emitter to turn off a short turn after the input signal to the tansistor is removed, as for example, in pulse type circuits used in digital computers.

In the past, circuits to compensate for the aforementioned carrier storage effect have included complicated and inefficient circuits to provide the transistor with a negative bias when the input signal is removed.

The device of this invention utilizes a simple and reliable multivibrator circuit which performs the function of a trigger circuit while at the same time providing a low impedance path to remove the excess minority carriers stored in the base of the transistor.

It is therefore an object of this invention to provide an improved transistor amplifier.

It is another object of this invention to provide a transistor circuit free from minority carrier storage effect.

It is a further object of this invention to control the flow of current in the output electrode circuit of a transistor.

It is still another object of this invention to provide a circuit for eliminating the minority carrier storage effect in a transistor.

It is a still further object of this invention to provide a transistor pulse amplifier with an improved pulse response output.

It is another object of this invention to provide a low impedance path for the excess minority carriers in the base of a transistor when said transistor ceases conduction.

Other objects of invention will become apparent from the following description taken in connection with the accompanying drawing in which the single figure is a schematic of the device of the invention.

Referring to the single figure, the pulse amplifier transistors 1 and 2 have their collectors connected through load resistors 3 and 4, respectively, to the B+ terminal of D.-C. power supply 30 and their emitters connected through resistors 5 and 6, respectively, to the ground terminal. Transistors 1 and 2 are connected to the input trigger circuit multivibrator 10 through resistors 7 and 8, respectively. Resistors 7 and 8 are of sufficiently low value to allow transistors 1 and 2 to become saturated when a triggering voltage is applied. Diode 11 is connected in parallel with resistor 7 having its anode connected to the base of transistor 1 and its cathode connected to point 13. Diode 11 provides a low impedance path between the base of transistor 1 and point 13 in the output circuit of multivibrator 10. Similarly, diode 12 is connected across resistor 8 to provide a low impedance path between the base of transistor 2 and point 14 in the output circuit of multivibrator 10. Multivibrator 10 is composed of transistors 15 and 16 whose emitters are connected in common and through a low impedance resistor 17 to the B— terminal of D.-C. supply 30 which is at a substantially lower potential than ground. The base of each transistor is connected through a respective resistor, 18 and 19, to B—. The base of transistor 15 is connected through capacitor 21 and resistor 22 to the collector of transistor 16, and the base of transistor 16 is connected through capacitor 23 and resistor 28 to the collector of transistor 15. Resistors 27 and 26 connect the transistor collectors respectively to a B+ supply. As shown, transistors 1 and 2 are N–P–N. If transistors 1 and 2 were P–N–P, the B+ supply would be connected to the emitter and the collectors would be connected through resistors 3 and 4 to ground. Likewise, N–P–N transistors 15 and 16 of multivibrator 10 could be P–N–P transistors, in which case the emitter and collector connections would be reversed in each transistor. Multivibrator 10, as shown, is bistable, and the input trigger pulse is a positive pulse received at terminal 24 to flip the circuit to one state, or a positive pulse received at terminal 25 to flip the circuit to its other state. In one state, transistor 15 conducts, and in the other state, transistor 16 conducts. A negative pulse at terminal 24 would be equivalent to a positive pulse at terminal 25 and vice versa because of the fact that the output potential at a loaded collector circuit is the inverse of the input potential applied to the base circuit.

The conduction of transistors 1 and 2 is controlled by multivibrator 10 through points 13 and 14 of the collector circuits of transistors 16 and 15 of the multivibrator. In order to commence conduction in either transistor, the base must be increased in potential with reference to the emitter. Transistor 1 will conduct when point 13, connected through resistor 7 to the base of transistor 1, rises in potential which occurs when transistor 16 of multivibrator 10 is nonconducting, and transistor 2 will conduct when point 14, connected through resistor 8 to the base of transistor 2, rises in potential which occurs when transistor 15 of multivibrator 10 is nonconducting. When transistor 1 is nonconducting, transistor 16 is conducting thereby providing a low impedance current path from the base of transistor 1 through diode 11 to the B— terminal. A similar low impedance current path exists for the base of transistor 2 provided by diode 12 to the B— terminal. A similar low impedance current path exists for the base of transistor 2 provided by diode 12 to the B— terminal. Thus it can be seen that when transistor 1 is nonconducting point 13 is at a potential near B—, and when transistor 2 is nonconducting point 14 is at a potential near B—. It is this low impedance path between the positive and negative terminals of the B supply which draws off the minority carriers through the base-emitter circuit, providing a fast fall time in the signal outputs of power transistors 1 and 2.

In operation, assuming initially that multivibrator 10 is in the state wherein transistor 15 is conducting and transistor 16 is nonconducting, transistor 1 is conducting in a saturated condition by reason of the positive potential presented to the base through point 13 of the collector circuit of transistor 16. Current flows through the path from the B+ supply through load resistor 3, the collector-emitter circuit of transistor 1, through resistor 5 to ground. Also, initially, transistor 15 of multivibrator 10 is conducting and thereby causing transistor 2 to be nonconducting through the negative bias applied to the base from point 14.

When a positive pulse is presented to input terminal 25, the signal passed to the base of transistor 16 causes that transistor to commence conduction and the subsequent drop in potential at the collector of transistor 16 is coupled through capacitor 21 and resistor 22 to the base of transistor 15, causing that transistor to cease conducting. When transistor 16 commences conducting, point 13 decreases in potential acting to shut off the conducting transistor 1. The negative minority carriers in the base region near the collector of transistor 1 are attracted towards the emitter of transistor 1 because of the low impedance presented by the bast circuit of diode 11, point 13, the collector-emitter of transistor 16, resistor 17, and B—. By providing this low impedance connection to the base of transistor 1 at the time the transistor is cut off, the minority carriers stored in the base region near the collector are attracted away from the collector to the emitter. Thus, electron current flows from the more negative potential B— through resistor 17, the emitter-collector path of transistor 15, through diode 12, through the base-emitter circuit of transistor 2 to ground, while conventional current flows from the more positive ground through the emitter-base circuit of transistor 2 through diode 12 to B—. Therefore, the current in the collector of transistor 1 will fall sharply providing a fast fall time in the output current across load resistor 3.

A positive pulse presented to input terminal 24 will flip multivibrator 10 to its opposite state causing transistor 15 to conduct; point 14 then decreases in potential acting to shut off transistor 2. A low impedance path provided by diode 12, point 14, the collector-emitter circuit of transistor 15, resistor 17, and B— attracts the minority carriers in the base of transistor 2 away from the collector and towards the emitter and more positive ground in the same manner as described for transistor 1, thereby providing a fast fall time in the current flowing through load resistor 4.

Operation of the device of the invention has been described assuming multivibrator 10 to be bistable. It is also possible that the same circuit could be operated as a monostable or a free-running triggering device. In both monostable and free-running action the multivibrator would act to cut off the conducting transistor, and at the same time provide a low impedance path for the excess minority carriers in the previously conducting transistor.

N–P–N transistors 1 and 2 may be replaced by P–N–P transistors, in which case, as previously noted, the respective emitters would be connected to the B+ supply and respective collectors would be connected to ground.

Although the invention has been described and illustrated in detail, it is to be clearly understood that the same is by way of illustration and example only and is not to be taken by way of limitation, the spirit and scope of this invention being limited only by the terms of the appended claims.

I claim:

1. A transistor amplifier comprising a transistor having at least collector, emitter and base electrodes, means for establishing operating potentials on the electrodes of said transistor comprising a source of direct-current having B+, ground, and B— terminals, the B+ terminal and the ground terminal being connected across said collector and emitter electrodes, a unilateral conductive device connected in series with said base electrode said B— terminal and controllable for conduction in response to the current flowing in said base electrode, means for applying a triggering potential to said transistor to control conduction thereof, said trigger means connected in series with said base electrode and said unilateral conductive device to provide a minority carrier current path from said base to said B— terminal.

2. Claim 1 as described wherein said trigger means comprises a multivibrator having a pair of transistors having collector and base circuits interconnected so as to produce a trigger circuit of two degrees of stability, at least one of said transistors connected in series with said unilateral conductive device to provide a minority carrier current return path from said base electrode to said B— terminal.

3. In combination a first pair of transistors having at least collector, emitter and base electrodes, means for establishing operating potentials on the electrodes of said transistors comprising a source of direct-current having a B+, a ground, and a B— terminal, a pair of variable impedance circuits connected to the bases of each transistor, said variable impedance circuits controllable in response to the current flowing in said base electrodes, a second pair of transistors interconnected regeneratively so as to produce a trigger circuit of two degrees of stability, the output of said trigger circuit in one of said degrees of stability connected to one of said variable impedance circuits to provide a minority carrier current return path from said base electrode to said B— terminal, and the output of said trigger circuit in the other of said degrees of stability connected to the other of said variable impedance circuit to provide a triggering potential to the other said first pair of transistors.

4. Claim 3 as described wherein said variable impedance circuit comprises a diode and a resistor connected in parallel.

References Cited in the file of this patent

UNITED STATES PATENTS

| | | |
|---|---|---|
| 2,594,449 | Kircher | Apr. 29, 1952 |
| 2,706,811 | Steele | Apr. 19, 1955 |
| 2,708,720 | Anderson | May 17, 1955 |
| 2,752,530 | Aigrain | June 26, 1956 |
| 2,831,986 | Sumner | Apr. 22, 1958 |
| 2,840,728 | Haugk | June 24, 1958 |

OTHER REFERENCES

Article (1), "Nonsaturating Pulse Circuits . . .," Linvill, Proc. I. R. E., July 1955.